US008273636B2

(12) United States Patent
Neyret et al.

(10) Patent No.: US 8,273,636 B2
(45) Date of Patent: Sep. 25, 2012

(54) PROCESS FOR THE TRANSFER OF A THIN LAYER FORMED IN A SUBSTRATE WITH VACANCY CLUSTERS (75) Inventors: Eric Neyret, Sassenage (FR); Oleg Kononchuk, Grenoble (FR)

(73) Assignee: Soitec, Bernin (FR)

( * ) Notice: Subject to any disclaimer, the term of this patent is extended or adjusted under 35 U.S.C. 154(b) by 419 days.

(21) Appl. No.: 12/312,017

(22) PCT Filed: Oct. 27, 2006

(86) PCT No.: PCT/IB2006/003972
§ 371 (c)(1),
(2), (4) Date: Nov. 24, 2009

(87) PCT Pub. No.: WO2008/050176
PCT Pub. Date: May 2, 2008

(65) Prior Publication Data
US 2011/0097871 A1    Apr. 28, 2011

(51) Int. Cl.
*H01L 21/322*  (2006.01)
(52) U.S. Cl. .................. 438/458; 257/E21.568
(58) Field of Classification Search ............. 438/715
See application file for complete search history.

(56) References Cited

U.S. PATENT DOCUMENTS

| | | | |
|---|---|---|---|
| 6,774,040 B2 * | 8/2004 | Comita et al. | 438/689 |
| 2002/0090818 A1 * | 7/2002 | Thilderkvist et al. | 438/689 |
| 2005/0026391 A1 | 2/2005 | Ghyselen | |
| 2006/0172508 A1 | 8/2006 | Maleville et al. | |

FOREIGN PATENT DOCUMENTS

| | | |
|---|---|---|
| EP | 0 676 796 A2 | 10/1995 |
| EP | 0 961 312 A2 | 12/1999 |
| FR | 2 858 461 A1 | 2/2005 |
| WO | 2006/029651 A1 | 3/2006 |

OTHER PUBLICATIONS

International Search Report for PCT/IB2006/003972, Aug. 1, 2007, 3 pages.
Rayssac, O. et al., "From SOI to SOIM technology: Application for specific semiconductor processes," Electrochemical Society Proceedings, vol. 2001-3, pp. 39-44.
Sanchez, S. et al., "Spontaneous direct bonding of thick silicon nitride," J. Micromech. Microeng. 7 (1997), pp. 111-113.
Tate, N. et al., "Defect Reduction of Bonded SOI Wafers by Post Anneal Process in H2 Ambient," Proceedings 1998 IEEE International SOI Conference, Oct. 1998, pp. 141-142.
Written Opinion for PCT/IB2006/003972, Aug. 1, 2007.
International Preliminary Report on Patentability for PCT/IB2006/003972, dated Apr. 8, 2009.

* cited by examiner

*Primary Examiner* — Thao P. Le
(74) *Attorney, Agent, or Firm* — TraskBritt (57) ABSTRACT

Methods for forming semiconductor structures comprising a layer transferred from a donor substrate are provided in which the resulting structure has improved quality with respect to defects and resulting structures therefrom. For example, a semiconductor-on-insulator (SeOI) structure can be formed by a method comprising:—providing a donor substrate having a first density of vacancy clusters;—providing an insulating layer; —transferring a thin layer from the donor substrate to a support substrate with the insulating layer thereon;—curing the transferred thin layer to reduce the first density of vacancy clusters to a second density; and being characterized in that the step of providing an insulating layer comprises providing an oxygen barrier layer to be in contact with the transferred thin layer, the oxygen barrier layer limiting diffusion of oxygen toward the thin layer during the curing.

24 Claims, 3 Drawing Sheets

PROCESS FOR THE TRANSFER OF A THIN LAYER FORMED IN A SUBSTRATE WITH VACANCY CLUSTERS

CROSS-REFERENCE TO RELATED APPLICATION

This is a national phase entry under 35 U.S.C. §371 of International Patent Application PCT/IB2006/003972, filed Oct. 27, 2006, published in English as International Patent Publication WO 2008/050176 A1 on May 2, 2008.

TECHNICAL FIELD

The general field is in the field of semiconductor processes and materials. The particular field of the application relates to semiconductor-on-insulator materials and improvements in the processing speed, efficiency, and quality of semiconductor structures.

BACKGROUND

The present invention relates to processes for forming structures by a transferring of a thin layer of semiconducting material from a donor substrate to a support substrate. One field of application is in the field of semiconductor-on-insulator (SeOI) structures, for example, silicon-on-insulator (SOI) structures, that provide structures acting as substrates for electronics, optics and optoelectronics. SeOI structures are formed to include an insulating layer inserted between a thin layer made of a semiconducting material and a support substrate. SMART CUT® type processes are an example of a process of this type. These processes correspond to at least some embodiments of the present invention.

Production of an SeOI structure using the SMART CUT® process, and particularly an SeOI structure in which the thin layer is particularly thin (typically less than 400 nm), requires the use of an initial donor substrate without any growth defects in the form of vacancy clusters (known, for instance, as Crystal Originated Particles or COPs). The presence of vacancy clusters in the volume of the donor substrate may generate defects for which the size is larger than the thickness of the thin layer of the final SeOI structure. These resulting "through" defects are fatal defects because a component formed in a portion of the SeOI structure that includes one of these defects will not be operable. The presence of these through defects is, therefore, a parameter that controls the quality of components that will be created on the final structure. Therefore, it is essential to minimize the presence of these through defects. Obviously, it will be understood that the problem of such defects is particularly important if the thickness of the thin layer is "thin," such that the size of vacancy clusters are significant in comparison to the thickness of the layer.

One solution for limiting the number of through defects in an SeOI substrate and that has been frequently used in the past is to use an initial substrate with a very high crystallographic quality and having a low density of COPs.

An initial substrate is typically formed by cutting into an ingot obtained by the CZ process (Czochralski pulling). Control over the pulling speed and the ingot-cooling rate provides a means for reducing the quantity of vacancy cluster type defects. Thus, an initial substrate with almost no COPs is typically formed by cutting an ingot obtained by the CZ (Czochralski pulling) process using very specific pulling conditions and, in particular, using very slow pulling (pulling also designated by the name "Very Slow Pull" to obtain what those skilled in the art call a "Near Perfect Crystal," due to the very low number of defects).

Substrates formed by cutting an ingot obtained by simpler and/or faster pulling processes have comparatively more vacancy clusters and are, therefore, considered to be incompatible with the constraints imposed in target application fields (such as optics, electronics or optoelectronics).

For example, a substrate formed by cutting a Near Perfect Crystal obtained by a "Very Slow Pull" type pulling at a rate of less than 0.5 mm/min. will typically have a density of COPs (larger than 0.1 µm) between 0.045 and 0.075 COPs/cm$^2$ (equivalent to 30 to 50 COPs larger than 0.1 µm in a 300 mm diameter wafer with a surface area of 660 cm$^2$, allowing for a 5 mm exclusion area around the wafer). In comparison, a substrate obtained using standard pulling at a rate 1.2 to 1.5 times faster than the "Very Slow Pull" type pulling, will have a density of COPs (larger than 0.1 µm) between 1.5 and 4.5 COPs/cm$^2$ (equivalent to 1000 to 3000 COPs larger than 0.1 µm in a 300 mm diameter wafer).

It will be noted that the ingot-cooling rate during pulling is another factor that will influence the crystallographic quality. Indeed a high cooling rate (pulling designated as "Fast Cool") is accompanied by an increase in the density of defects. Therefore, a substrate obtained by cutting an ingot obtained by "Fast Cool" type pulling is also incompatible with imposed constraints in the application fields of the present invention.

The production efficiency for a quality substrate (Near Perfect Crystal with almost no COPs by means of a CZ "Very Slow Pull" type pulling) is significantly lower than the production efficiency of substrates using simpler and/or faster pulling processes. Therefore, the production of a near perfect substrate by "Very Slow Pull" type pulling is particularly expensive; its cost is thus typically 30% greater than the cost of substrates obtained by standard CZ pulling.

It will be noted that it has also been proposed to use a previously heat-treated standard substrate to reduce the quantity of COPs as an initial substrate in a process for making an SOI structure. However, the use of such a previous heat treatment is not satisfactory. This treatment modifies the surface properties of the initial substrate (and, in particular, increases its surface roughness) such that problems can occur during bonding of the initial substrate to a support substrate (and particularly degradation of the bonding quality). Furthermore, this previous heat treatment can generate "slip line" type defects or oxygen precipitates that could compromise recycling of the initial substrate that is usually used in a SMART CUT® type process.

In order to improve the vacancy cluster characteristics of semiconductor structures, the assignee has proposed in published application US 2006/0172508 methods for forming a semiconductor-on-insulator structure, in which a donor substrate having a first density of vacancy clusters is provided, and wherein, a thin layer is transferred from the donor substrate to the support substrate and the transferred thin layer is cured to reduce the first density of vacancy clusters to a second density of vacancy clusters.

In particular, curing of the transferred thin layer can include applying a thermal annealing to the structure.

The methods of US 2006/0172508 notably allow reducing the price cost of substrates made by transfer of a thin layer of semiconducting material from a donor substrate to a support substrate and, particularly, the price cost of SeOI substrates. More specifically, the methods of US 2006/0172508 enable the use of initial substrates formed by cutting an ingot obtained by CZ pulling, which is more cost effective than the "Very Slow Pull" type pulling to obtain a near perfect crystal, in a SMART CUT® type transfer process, while maintaining a crystalline quality of the thin layer compatible with the envisaged applications, without encountering any bonding or recycling type problems caused by use of the previous heat treatment technique mentioned above.

The inventors of the present application have, however, shown that the curing step, typically a thermal annealing, of the methods of US 2006/0172508 can have certain limitations.

Typically, the vacancy clusters are cavities, with sizes ranging between a few hundreds and a few thousands of Angstroms, which inner walls are coated by a thin silicon oxide film. This coating must be dissolved before the thermal annealing of the curing step can be effective.

It appeared that the thermal annealing of the curing step has a side effect linked to the thermal balance of the oxygen concentration in the depth of the thin layer. Indeed, the thermal annealing may cause oxygen, in particular, oxygen present within the insulating buried layer (for instance, a silicon oxide layer), to diffuse toward the thin layer and migrate to the inner walls of the vacancy clusters.

In addition to a possible thinning of the thin layer, this diffusion of oxygen, in particular, oxygen of the buried layer, toward the free face of the thin layer may reduce the effectiveness of the dissolution of the vacancy clusters by the methods of US 2006/0172508.

Therefore, it would be beneficial to provide improved methods with more effective vacancy clusters dissolution, at least, for example, for forming SeOI structures having improved defect characteristics and processing efficiencies.

SUMMARY OF THE INVENTION

In accordance with the principles of the present invention, methods for forming semiconductor-on-insulator structures having improved vacancy clusters dissolution characteristics, and structures resulting from the methods are provided.

A method for forming a semiconductor-on-insulator structure can be provided, for example, in which a donor substrate having a first density of vacancy clusters is provided, an insulating layer is provided, a thin layer is transferred from the donor substrate to a support substrate with the insulating layer thereon, the transferred thin layer is cured to reduce the first density of vacancy clusters to a second density, and an oxygen barrier layer to be in contact with the transferred thin layer is provided as part of the insulating layer, the oxygen barrier layer limiting diffusion of oxygen toward the thin layer during the curing.

The following gives a list of some preferred but not limitative aspects of the invention:
  the insulating layer consists of the oxygen barrier layer, the oxygen barrier layer being provided before transfer on the donor substrate surface, or on the support substrate surface;
  the step of providing an insulating layer further comprises providing a buried layer to be interposed between the support substrate and the oxygen barrier layer, so that the insulating layer comprises both the buried layer and the oxygen barrier layer;
  the insulating layer is provided on the support substrate surface;
  the insulating layer is provided by thermal oxidizing of the support substrate surface;
  the insulating layer is provided by deposition on the support substrate surface;
  the oxygen barrier layer is provided on the insulating layer provided on the support substrate, and the thin layer is transferred from the donor substrate onto the oxygen barrier layer;
  the oxygen barrier layer is provided on the donor substrate surface;
  the oxygen barrier layer is transferred together with the thin layer onto the support substrate;
  the insulating layer is provided onto the support substrate surface;
  the insulating layer is provided on the oxygen barrier layer;
  the oxygen barrier layer and the insulating layer are transferred together with the thin layer onto the support substrate;
  the oxygen barrier layer is provided by depositing a silicon nitride layer;
  the deposition is performed by Plasma Enhanced Chemical Vapor Deposition;
  the curing is performed by applying a thermal annealing to the structure obtained after transfer;
  the thermal annealing is performed under a non-oxidizing atmosphere;
  the thermal annealing is performed under an atmosphere containing pure hydrogen, pure argon or a mixture of hydrogen and argon;
  the thermal annealing is a rapid thermal processing (RTP), or is performed in a furnace;
  the thermal annealing is a smoothing annealing performed under an atmosphere containing hydrogen and hydrochloric acid;
  the method further comprises providing a zone of weakness in the donor substrate to define the thin layer to be transferred, combining the donor substrate, oxygen barrier layer, insulating layer and support substrate together, and detaching the donor substrate at the zone of weakness;
  the donor substrate is formed by cutting an ingot that is pulled at a rate of at least 0.75 mm/min.;
  the donor substrate has a first density of vacancies larger than 0.14 µm that is less than $0.01/cm^2$, and after curing the transferred layer as a second density of $0.075/cm^2$ or less;
  the donor substrate has a first density of vacancies larger than 0.2 µm that is greater than $1.5/cm^2$, and after curing the transferred layer as a second density of $0.075/cm^2$ or less;
  the method further comprises detaching an additional thin layer from the donor substrate for forming circuitry therein.

BRIEF DESCRIPTION OF THE DRAWINGS

Features of the invention, its nature, and various advantages will be apparent from the following detailed description, taken in conjunction with the accompanying drawings in which.

DETAILED DESCRIPTION

The present invention relates to processes for forming a semiconductor-on-insulator structure. In some embodiments, the invention relates particularly to a SMART CUT® type transfer process, for which the main steps are mentioned below.

In a SMART CUT® type transfer process, and with reference to the different figures, a donor substrate 1 made of a semiconducting material from which the thin layer 10 is formed is exposed to implantation of species (represented by arrows 6) to create a zone of weakness 60 within the thickness of the donor substrate 1. The face of the donor substrate 1 through which the implantation was made is then brought into intimate contact with a support substrate 2. The donor substrate 1 is then detached at the level of the weakness zone resulting in part of the donor substrate 1 thus being transferred onto the support substrate 2 to form the thin layer 10 on the support substrate 2.

When making an SeOI structure, an insulating layer 30 is inserted between the thin layer and the support substrate.

The context of the present invention is similar to the one of US 2006/0172508. In particular, the donor substrate is not necessarily formed by cutting an ingot with a near perfect crystal quality ("Near Perfect Crystal") obtained by "Very Slow Pull" type CZ pulling. On the contrary, in the context of one advantageous embodiment, the donor substrate can be formed by cutting an ingot of semiconducting material that is obtained by pulling creating vacancy clusters with an average size less than the average size of clusters present in a near perfect substrate formed by cutting an ingot obtained by a slow pulling.

According to one possible embodiment, the process according to the invention comprises a prior step for preparation of the donor substrate, which includes an operation to make an ingot of semiconducting material by pulling creating vacancy clusters with an average size less than the average size of clusters present in a near perfect crystal obtained by slow pulling, and an operation to cut out the donor substrate in this ingot. The pulling mode mentioned above has the advantage that it is not very expensive compared with the "Very Slow Pull" type pulling. For example, this type of pulling mode includes a fast CZ pulling or fast cooling to obtain a crystal commonly called a "Low Defect Crystal" or a crystal called a "Standard Crystal."

According to one advantageous embodiment, nitrogen doping can be performed when pulling the ingot from which the donor substrate is obtained. This type of nitrogen doping can facilitate the curing step (which will be described in detail later) so as to remove COPs from the transferred thin layer. Indeed, nitrogen doping of the ingot provides a means of generating smaller COPs (admittedly with a greater density), more susceptible to be cured by a heat treatment. Preferably, the nitrogen doping carried out during pulling of the ingot is adapted to introduce between $10^{14}$ and $5*10^{15}$ atoms of nitrogen/$cm^3$.

According to one advantageous embodiment, the support substrate is also prepared in the manner described above for the donor substrate, particularly by cutting an ingot formed by standard CZ pulling. The support substrate may also be subjected to nitrogen doping.

As concerns the variation in the size of COPs and the variation of density of COPs as a function of the pulling rate and/or the cooling rate of an ingot of semiconducting material according to the CZ process, reference can be made to FIG. 1 and the corresponding description of US 2006/0172508. Diagrammatically, a substrate cut out in an ingot obtained by standard or fast pulling has a high density of small COPs, while a substrate cut out in an ingot obtained by a slow pulling or a very slow pulling has a low density of large COPs. Thus, controlling the pulling speed provides a means of controlling the size and density of COPs. In the same way, control over the ingot cooling rate provides a means of controlling the size and density of COPs. Thus, fast cooling of an ingot reduces the size of defects but increases the density of the defects.

In the remainder of the description, we will use an example of a pulling creating vacancy clusters with an average size of less than the size of clusters present in a near perfect crystal (for example, like that obtained with a "Fast Pull" type pulling). It will be understood that the present invention is not limited to this pulling mode, but can be extended to include any pulling mode, and advantageously to any pulling mode resulting in a substrate with an important number of COPs, but that is more economic than pulling to obtain a near perfect crystal substrate.

Thus, preparation of the support substrate by a CZ "Fast Pull" type pulling, which is significantly less expensive than a "Very Slow Pull" type pulling, provides an initial substrate with a high density of small COPs.

When the donor substrate is made by a fast pulling type CZ process (in opposition to the very slow pulling), and provided that the donor substrate has not been subjected to a step that could increase the size of the COPs before transfer of the thin layer, the thin layer will not have COPs likely to generate through defects immediately after transfer onto the support substrate. Due to fast pulling type, the donor substrate will only have small COPs (admittedly with a large density) that are not likely to pass through the entire thickness of the transferred thin layer. However, some operations conventionally performed during a SMART CUT® type transfer process could increase the size of COPs, thus causing the formation of through defects. For example, oxidation, basic cleaning and polishing act on COPs and increase their size, particularly by etching of walls of the COPs in all directions.

Hence, in the context of making an SeOI substrate according to the invention, and in order to avoid the formation of through defects, the donor substrate is not subjected before transfer to any step (such as an oxidation, a basic cleaning and a polishing) that may increase the size of COPs and thus generate through defects.

When the SMARTCUT® process is used conventionally to make an SeOI type substrate, the donor substrate is typically subjected to thermal oxidation before being exposed to implantation of species to form the insulating layer inserted after transfer between the thin layer and the support substrate. The donor substrate oxidation step consumes material on the surface of the donor substrate, but also on the walls of COPs. The size of COPs is then increased by the same order of magnitude as the thickness of oxide produced. Moreover, in its material consumption, the effect of the thermal oxidation is to integrate volume COPs that are then transferred to the surface. Thus, for a conventional embodiment of an SeOI substrate, the size of COPs could increase due to the thermal oxidation before transfer of the donor substrate, thus causing through defects after the transfer. On the other hand, as has already been mentioned, due to the fast pulling that only generates small COPs (or, more precisely, such that the generated density of COPs larger than about 0.14 μm is less than 0.01/cm², which is equivalent to only a few COPs larger than 0.14 μm for a 300 mm wafer), in the lack of oxidation of the donor substrate before transfer (or, more generally, the use of any operation that could increase the size of COPs before the transfer), the COPs will usually not be large enough to form a through defect immediately after the transfer.

In the context of making an SeOI substrate according to the invention, and in order to avoid the formation of through defects, the donor substrate is not submitted to any operation that could increase the size of COPs before the transfer.

In particular, the insulating layer is not formed conventionally as described above by submitting the donor substrate to thermal oxidation. Thus, before the transfer, the process according to the invention includes a step for formation of the insulating layer done in a manner so as to not increase the size of vacancy clusters present in the thin layer.

In accordance with the invention, and with reference to the accompanying drawings, a method is proposed for forming an SeOI structure that implements a step of providing an insulating layer 30, the step comprising providing an oxygen barrier layer 4 to be in contact with the transferred thin layer 10.

According to first, second and third embodiments presented hereafter, the step of providing an insulating layer 30 further comprises providing a buried layer 3 to be interposed between the support substrate 2 and the oxygen barrier layer 4, so that the insulating layer 30 comprises both the buried layer 3 and the oxygen barrier layer 4.

According to another embodiment, the insulating layer 30 consists of the oxygen barrier layer 4, the oxygen barrier layer 4 being provided before transfer on the donor substrate surface or on the support substrate surface.

As shown in FIGS. 1A-1F and 2A-2F, according to a first and second possible embodiments, the buried layer 3 is provided on the support substrate 2.

The buried layer 3 can, for instance, be formed by thermal oxidizing the support substrate (rather than the donor substrate).

The buried layer 3 can also be formed by deposition on the donor substrate. For example, this type of deposition could be made using the Low Pressure Chemical Vapor Deposition (LPCVD) technique, for example, at low temperature and under an atmosphere containing the TEOS (tetraethylorthosilicate Si(OC₂H₅)₄) precursor, or at high temperature (High Temperature Oxide (HTO)) under an atmosphere containing silane and oxygen. This type of deposition could also be made using the Plasma Enhanced Chemical Vapor Deposition (PECVD) technique that can be used at a lower temperature than the LPCVD technique.

The buried layer 3 deposited onto the support substrate 2 is not limited to an oxide layer (such as an $SiO_2$ layer), but extends to all types of insulating layers, notably those conventionally used in the field of SeOI manufacturing, for instance, a diamond layer or a silicon nitride layer (such as an $Si_3N_4$ layer).

As shown on FIGS. 3A-3F, according to a third possible embodiment, the buried layer 3 may be provided on the side of the donor substrate 1. However, in this case, the buried layer 3 is not formed directly on the support substrate surface. Indeed, an oxygen barrier layer 4 is provided on the donor substrate surface, so as to be interposed between the buried layer 3 and the donor substrate 1 (see FIG. 3D).

In this third embodiment, the buried layer 3 is thus formed on the oxygen barrier layer 4, for instance, by deposition. The deposition can be made using the LPCVD technique under an atmosphere containing the TEOS precursor, as shown, for instance, in WO 2006/029651.

As for the first and second embodiments, the buried layer 3 deposited onto the oxygen barrier layer 4 in the context of this third embodiment, is not limited to an oxide layer (such as an $SiO_2$ layer), but extends to all types of insulating layers, notably those conventionally used in the field of SeOI manufacturing, for instance, a diamond layer or a silicon nitride layer (such as an $Si_3N_4$ layer).

The process according to the first, second and third embodiments of the invention also comprises a step of providing an oxygen barrier layer 4, which is to be interposed between the transferred thin layer 10 and the buried layer 3 in the SeOI structure 20 obtained after transfer. This oxygen barrier layer 4 is more precisely made of a material having a low oxygen diffusivity chosen so that layer 4 forms a "barrier" to oxygen diffusion.

Figure 1A:
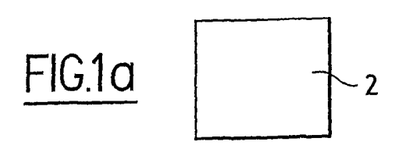
FIGS. 1A-1F represent steps of a first embodiment of a method according to the invention, wherein, before transfer of the thin layer, the buried layer is provided on the support substrate surface and the oxygen barrier layer is provided on the donor substrate surface.
Figure 1B:
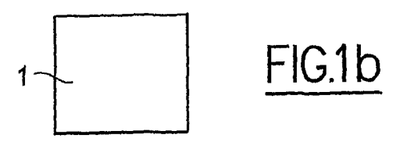
Figure 1C:
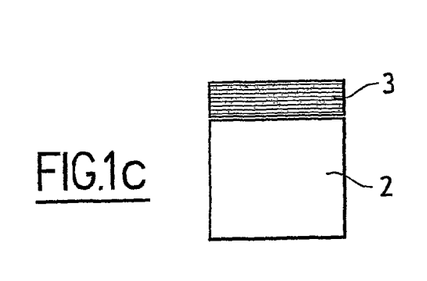
Figure 1D:
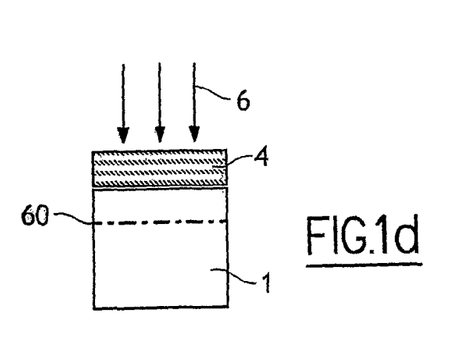
Figure 1E:
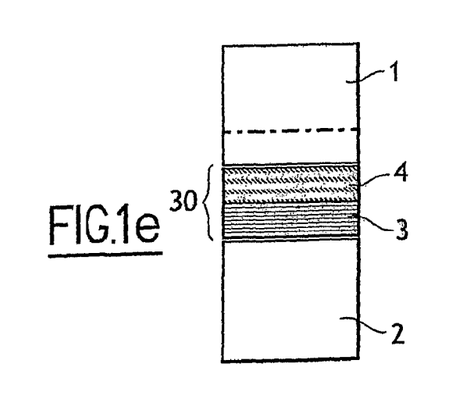
Figure 1F:
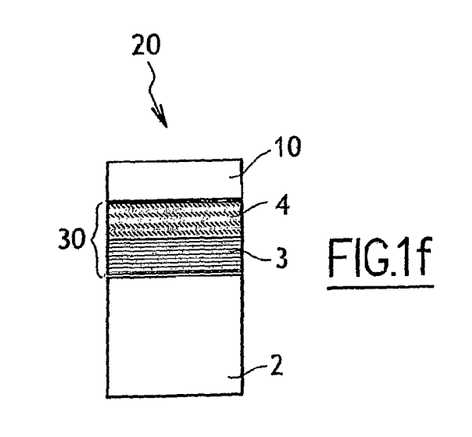
Figure 3A:
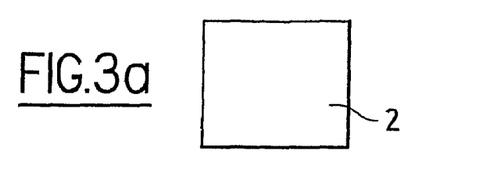
FIGS. 3A-3F represent steps of a third embodiment of a method according to the invention, wherein, before transfer of the thin layer, the oxygen barrier layer is provided on the donor substrate surface and the buried layer is provided on the oxygen barrier layer.
Figure 3B:
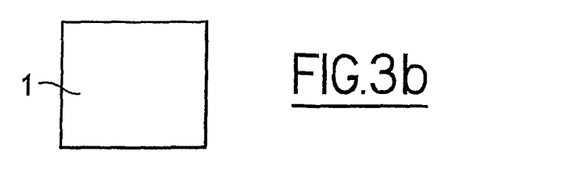
Figure 3C:
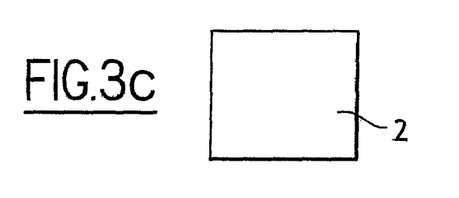
Figure 3D:
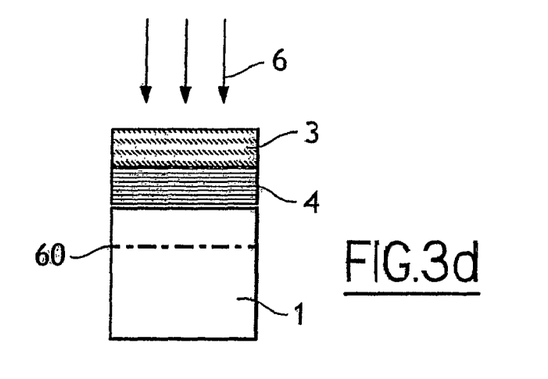
Figure 3E:
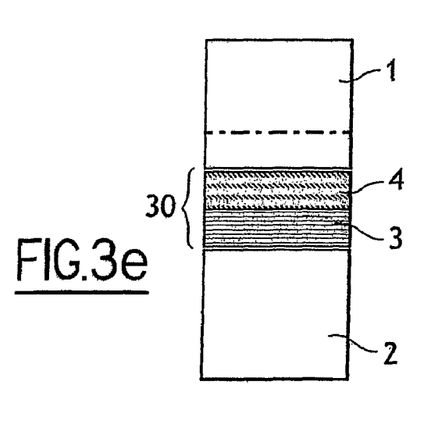
Figure 3F:
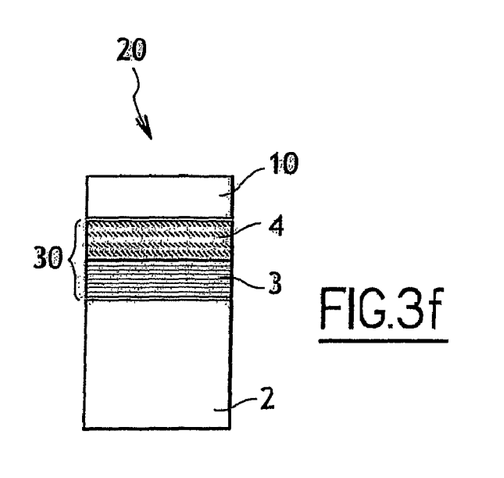

In the first and third embodiments, the oxygen barrier layer 4 is provided on the donor substrate 1 surface (see FIGS. 1D and 3D, respectively).

Figure 2A:
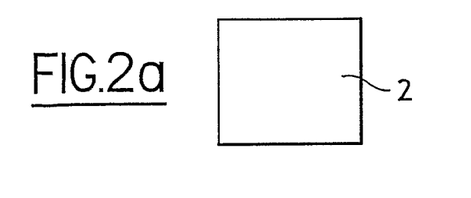
FIGS. 2A-2F represent steps of a second embodiment of a method according to the invention, wherein, before transfer of the thin layer, the buried layer is provided on the support substrate surface and the oxygen barrier layer is provided on the buried layer.
Figure 2B:
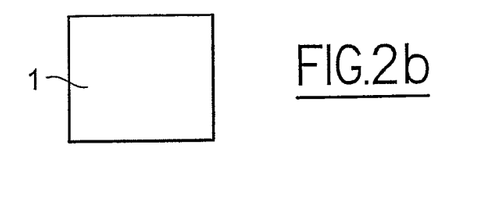
Figure 2C:
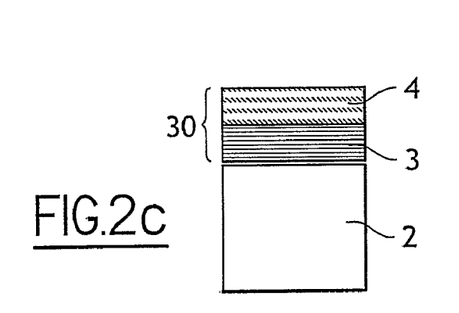
Figure 2D:
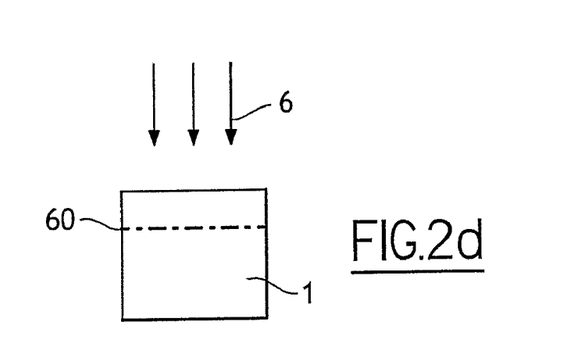
Figure 2E:
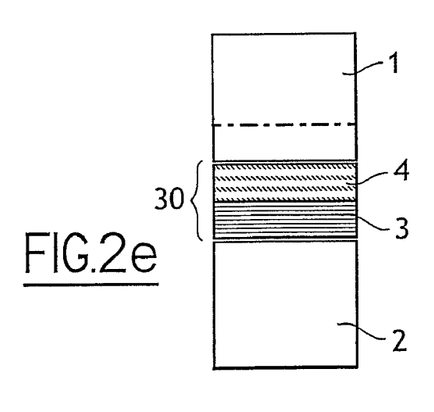
Figure 2F:
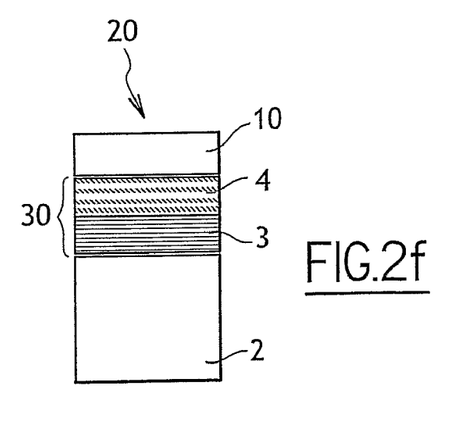

In the second embodiment, the oxygen barrier layer 4 is provided on the buried layer 3 provided on the support substrate 2 (see FIG. 2C).

The oxygen barrier layer 4 is, for instance, provided by deposition (onto the donor substrate 1, or onto the buried layer 3 provided on the support substrate 2), this deposition being possibly made by LPCVD.

The oxygen barrier layer 4 is preferably a silicon nitride layer ($Si_xN_y$ layer), such as an $Si_3N_4$ layer, material known for its low oxygen diffusivity.

Another embodiment has been discussed previously according to which the insulating layer 30 consists of the oxygen barrier layer 4. It is mentioned that this embodiment can be seen as a variant to the second and third embodiments according to which the oxygen barrier layer 4 and the buried layer 3 are made of the same material (for instance, of silicon nitride).

In particular, within the context of this variant, the step of providing the oxygen barrier layer 4 and the step of providing the buried layer 3 can be performed simultaneously, for instance, by LPCVD deposition of silicon nitride on the support substrate 2 (second embodiment) or on the donor substrate 1 (third embodiment), so that the oxygen barrier layer 4 and the buried layer 3 form a single layer (insulating layer 30).

Now returning to the general description of the SMART CUT® type transfer process according to the preferred embodiment of the invention, the support substrate 2 is exposed to implantation of species (represented by arrows 6 on FIGS. 1D, 2D and 3D) adapted to create a weakness zone 60 within its thickness.

Note that in the third embodiment in which the buried layer 3 is provided on the oxygen barrier layer 4 provided on top of the donor substrate 2, this implantation of species could be made through the stack {buried layer+oxygen barrier layer} (see FIG. 3D). In this case, the buried layer 3 can act as a protection layer to protect the surface of the donor substrate on which the implantation is made.

According to one possible embodiment, such a buried layer is thus deposited on the donor substrate before implantation to act as a protection layer, and is then withdrawn after implantation before putting the donor and the support substrates into contact.

In this third embodiment, it is also possible to perform the implantation through the oxygen barrier layer 4, the buried layer 3 being provided after implantation on the oxygen barrier layer 4.

As a variant to the possible embodiments of the invention described above, other implantation techniques (co-implantation of several species, implantation by plasma) and/or other thin layer transfer techniques may be used.

Furthermore, the quasi-absence of large COPs (typically larger than about 0.14 μm) provides a means of transferring defect-free layers that are thinner than those that can traditionally be transferred (when the donor substrate has large defects). The presence of "through" defects in the thin layer is directly related to the size of COPs in the donor substrate.

Thus, in the context of this invention, implantation parameters may be adjusted so as to transfer layers with a thickness of about 0.15 μm or more.

Returning to the description of a possible embodiment of the invention, the donor and support substrates are then brought into intimate contact (see FIGS. 1E, 2E amd 3E), and the donor substrate 1 is then detached at the level of the weakness zone 60. Part of the donor substrate 1 is then transferred onto the support substrate 2 to form the thin layer 10 on the support substrate 2 (see FIGS. 1F, 2F and 3F) with the insulating layer 30 interposed between the support substrate 2 and the transferred thin layer 10 and with the oxygen barrier layer 4 in contact with the transferred thin layer 10.

Bonding can be facilitated by applying a plasma activation treatment to either one or both faces of the substrates brought into contact. This is particularly advantageous if the zone of weakness 60 is obtained by co-implantation, which in some cases can make the bonding step more sensitive.

Note that a treatment intended to clean the faces of the donor and the support substrates to be brought into contact may be used before bringing the surfaces into intimate contact so as to reinforce the bonding energy. However, such a cleaning treatment is suitable within the context of the invention only to provide reduced etching of treated faces and, therefore, only having a limited impact on COPs (especially when cleaning the bare donor substrate of FIG. 2D). Cleaning may be done by an RCA wet cleaning type of chemical surface treatment. The aggressiveness of this RCA treatment may be controlled so that only a small amount of etching is done, for example, by monitoring the chemical bath temperature, the exposure time or the product concentration. In particular, it is worth mentioning that the etching rate of faces subjected to a cleaning treatment is limited (a few Angstroms per minute) and in this respect, the cleaning treatment can be adapted to only cause a small amount of etching.

With regard to cleaning and bonding of the support and donor substrates, reference can, for instance, be made to the article entitled "From SOI to SOIM technology; Application for specific semiconductor processes," by O. Rayssac et al., in *Electrochemical Society Proceedings*, vols. 2001-3, which shows structures bonded by contacting ($SiO_2/Si_3N_4$), ($Si_3N_4/Si_3N_4$), ($Si_3N_4/Si$) and ($Si/SiO_2$) surfaces.

It will also be noted that a chemical mechanical step can be applied to the silicon nitride layer as a surface preparation step in order to enable proper bonding.

Similar to the methods of US 2006/0172508, the process according to the invention also comprises, after the transfer, a step for curing of the vacancy clusters (or COPs) that are present in the transferred thin layer 10. This curing step is preferably done immediately after the transfer and, in any case, preferably before any operation that could increase the size of COPs (for example, such as sacrificial oxidation of the thin layer).

According to one possible embodiment, this curing step is performed by carrying out a thermal annealing of the structure obtained after the transfer. This step can cure the thin layer transferred from the donor substrate to the support substrate of the small COPs.

COPs present in a layer with a thickness of up to 5 μm can be cured by annealing, for example, under a non-oxidizing atmosphere. The high mobility of interstitial atoms present in the volume of the layer then enables reconstruction of the crystal at the COPs, which are thus eliminated. For example, this annealing under a non-oxidizing atmosphere (for example, under a neutral and/or reducing atmosphere, and particularly under an atmosphere containing argon and/or hydrogen) of the structure obtained after detachment may be a high temperature RTP (Rapid Thermal Processing) annealing according to which the structure obtained after the transfer is heat treated individually, or a thermal annealing performed in a furnace in which different structures are treated in batch.

RTP annealing may be an RTA (Rapid Treatment Annealing) type of annealing done under an atmosphere containing pure hydrogen, pure argon or a hydrogen/argon mix. The annealing temperature is typically between 1050° C. and 1250° C., and the annealing duration is typically less than 60 seconds. Annealing in the furnace may be done at a temperature between 900° C. and 1200° C. for several hours, under an atmosphere containing pure hydrogen, pure argon or a hydrogen/argon mix.

Yet another example of thermal annealing is smoothing annealing carried out under an atmosphere containing hydrogen and hydrochloric acid, for example, like that presented in published US patent application US2002/090818.

This type of smoothing annealing may be an RTA type fast annealing, or of the epitaxy equipment type (duration between a few seconds and a few minutes), the structure obtained after detachment then being treated individually. Smoothing annealing may be done in a furnace (of the order of a few hours), different structures can then be treated in batch.

The thermal budget of this curing by thermal annealing (in other words, particularly the annealing duration and temperature) is adapted as a function of the selected annealing type, the size of the COPs (which, as we have already seen above, depends particularly on the pulling rate and the cooling rate), the thickness of the thin layer and whether or not nitrogen doping is done. It will be noted that the curing annealing is more efficient when the COPs are smaller.

Note also that these annealing operations also have a smoothing effect on the surface of the thin layer (by reconstruction of the crystal on a smooth, non-oxidized surface).

Therefore, according to this thermal annealing step, the density of COPs in the thin layer is reduced.

Furthermore, in the structure 20 obtained after transfer, upon completion of the curing annealing step, diffusion of oxygen, in particular, oxygen from the buried layer 3 (for instance, when made of silicon oxide), toward the thin layer 10 is limited by the oxygen barrier layer 4.

Hence, oxygen from a buried oxide layer may not reach the COPs (and notably the COPs' inner walls) in the transferred thin layer 10, thus enhancing the COPs' dissolution efficiency of the curing step.

It is also mentioned that in the context of the embodiment according to which the insulating layer 30 consists of the oxygen barrier layer 4, COPs' dissolution efficiency is also enhanced, as there is no buried layer from which oxygen could migrate toward the thin layer 10.

Furthermore, the oxygen barrier layer 4 also proves advantageous in that it can have etching properties different from those of the thin layer 10 and/or the buried layer 3 (when present) and/or the support substrate 2. Preferential etching operations can thus be performed, which, for instance, can etch the material of the oxygen barrier layer 4 but not the material of the thin layer 3, etc. Such preferential etching operations may be useful in the context of device formation, such as the formation of FinFet devices.

The oxygen barrier layer also proves useful, when once processed, the thin layer is transferred onto a final substrate by bonding the SOI wafer 20 to the final substrate. Indeed, the initial support wafer 2 can then be mechanically grinded and/or chemically etched away. In that case, the oxygen barrier layer can also be useful to act as an efficient etch stop layer in combination with the insulating layer.

One recognized advantage of a SMART CUT® type transfer process is the possibility of recycling the donor substrate, either to form a new donor substrate from which a new active layer will be formed and transferred, or to make a new support substrate. In the context of this invention, the process may include a treatment step of the donor substrate after transfer of the thin layer onto the support substrate, adapted to enable recycling of the substrate (in other words, reusing it in the transfer process).

This treatment step is similar to the one described in US 2006/0172508. It is recalled below in a general way how it can be performed.

According to a first embodiment, this treatment step is adapted to enable recycling of the donor substrate so that it can be used again as a donor substrate, and is done without implementing operations that could increase the size of vacancy clusters present in this substrate. For example, this treatment step may include adapted polishing operations (CMP) and/or cleaning operations, done in a manner to have a limited impact on COPs, and not to increase vacancy size clusters.

According to a second embodiment, the treatment step is adapted to enable recycling of the donor substrate so that it can be used as a support substrate in making a new semiconductor-on-insulator substrate. In this case, the treatment step is designed to restore a surface condition compatible with molecular bonding (which typically requires a surface roughness less than 5 angstroms RMS). During this recycling treatment step, the amount of material removed within the thickness of the recycled substrate must be limited to less than 10 microns so that the thickness of the final SeOI wafer (after recycling) remains within the imposed thickness ranges (typically +/10 microns for a 775 micron wafer). In the context of this second embodiment, greater freedom is provided about the choice of operations that can be done during the recycling treatment. The size and density of COPs in the support substrate only has a limited impact on the quality of the final SeOI substrate. Therefore, it is possible to use substrates with a COP density equivalent to or even greater than the density of COPs in the initial substrate (for example, more than 1.5 COP/cm$^2$ or even more than 3 COP/cm$^2$, which, for a 300 mm wafer, is equivalent to more than 1000 or even 2000 COPs, respectively).

Obviously, this invention is in no way limited to the embodiments described and represented, but those skilled in the art would be capable of adding many variants or modifications.

In particular, for making an SOI substrate, the donor substrate is obviously formed by cutting a silicon ingot.

Furthermore, the invention is not limited to the CZ pulling process, but can be used with any type of ingot pulling process.

Finally, it will be understood that the invention is in no way limited to a given wafer diameter, and is applicable to all wafer diameters.

The invention claimed is:

1. A method for forming a semiconductor-on-insulator structure comprising:
   transferring a thin layer from a donor substrate to a support substrate;
   providing an oxygen barrier layer between the thin layer of the donor substrate and the support substrate;
   curing the transferred thin layer to reduce a density of vacancy clusters in the transferred thin layer from a first density of vacancy clusters to a second density of vacancy clusters; and
   limiting diffusion of oxygen into the thin layer from an insulating layer on the support substrate using the oxygen barrier layer during the curing.

2. A method according to claim 1, further comprising:
   forming the insulating layer to comprise the oxygen barrier layer; and
   providing the insulating layer on the support substrate before transferring the thin layer from the donor substrate to the support substrate.

3. A method according to claim 1, further comprising:
   forming the insulating layer to comprise a buried layer; and
   providing the buried layer between the support substrate and the oxygen barrier layer.

4. A method according to claim 3, further comprising providing the buried layer on a surface of the support substrate.

5. A method according to claim 3, further comprising thermally oxidizing a surface of the support substrate to form the buried layer.

6. A method according to claim 3, further comprising depositing the buried layer on a surface of the support substrate.

7. A method according to claim 3, further comprising:
   providing the buried layer on the support substrate;
   providing the oxygen barrier layer on the buried layer; and
   transferring the thin layer from the donor substrate onto the oxygen barrier layer after providing the oxygen barrier layer on the buried layer.

8. A method according to claim 3, further comprising providing the oxygen barrier layer on the donor substrate prior to transferring the thin layer from the donor substrate to the support substrate.

9. A method according to claim 8, further comprising transferring the oxygen barrier layer from the donor substrate to the support substrate together with the thin layer.

10. A method according to claim 9, further comprising providing the buried layer on the support substrate prior to transferring the thin layer from the donor substrate to the support substrate together with the thin layer.

11. A method according to claim 8, further comprising providing the buried layer on the oxygen barrier layer prior to transferring the thin layer from the donor substrate to the support substrate.

12. A method according to claim 11, further comprising transferring the oxygen barrier layer and the buried layer from the donor substrate to the support substrate together with the thin layer.

13. A method according to claim 1, further comprising forming the oxygen barrier layer by depositing a silicon nitride layer.

14. A method according to claim 13, further comprising employing a Plasma Enhanced Chemical Vapor Deposition (PECVD) process to deposit the silicon nitride layer.

15. A method according to claim 1, wherein curing the transferred thin layer comprises thermally annealing the thin layer after transferring the thin layer from the donor substrate to the support substrate.

16. A method according to claim 15, further comprising providing the thin layer in a non-oxidizing atmosphere while thermally annealing the thin layer.

17. A method according to claim 16, further comprising providing the thin layer in an atmosphere of at least one of pure hydrogen, pure argon and a mixture of hydrogen and argon while thermally annealing the thin layer.

18. A method according to claim 17, wherein thermally annealing the thin layer comprises rapid thermal processing (RTP).

19. A method according to claim 16, wherein thermally annealing comprises smoothing annealing performed under an atmosphere comprising hydrogen and hydrochloric acid.

20. A method according to claim 1, further comprising:
providing a zone of weakness in the donor substrate to define the thin layer;
combining the donor substrate, the insulating layer and support substrate together; and
detaching the thin layer from the donor substrate at the zone of weakness.

21. A method according to claim 1, further comprising:
pulling an ingot at a rate of at least 0.75 mm/min.; and
cutting the ingot to form the donor substrate.

22. A method according to claim 21, further comprising:
forming the donor substrate to have a density of vacancies larger than 0.14 μm that is less than $0.01/cm^2$;
wherein curing the transferred thin layer comprises reducing a density of vacancies larger than 0.14 μm in the transferred layer to a density of $0.075/cm^2$ or less.

23. A method according to claim 21, further comprising:
forming the donor substrate to have a density of vacancies larger than 0.2 μm that is greater than $1.5/cm^2$;
wherein curing the transferred thin layer comprises reducing a density of vacancies larger than 0.2 μm in the transferred layer to a density of $0.075/cm^2$ or less.

24. A method according to claim 1, further comprising detaching an additional thin layer from the donor substrate for forming circuitry therein.

* * * * *